United States Patent
Zhai et al.

(10) Patent No.: US 9,691,701 B2
(45) Date of Patent: Jun. 27, 2017

(54) SOC WITH INTEGRATED VOLTAGE REGULATOR USING PREFORMED MIM CAPACITOR WAFER

(71) Applicant: Apple Inc., Cupertino, CA (US)

(72) Inventors: Jun Zhai, San Jose, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 15/018,951

(22) Filed: Feb. 9, 2016

(65) Prior Publication Data

US 2017/0018497 A1 Jan. 19, 2017

Related U.S. Application Data

(60) Provisional application No. 62/192,785, filed on Jul. 15, 2015.

(51) Int. Cl.

| | |
|---|---|
| *H01L 29/49* | (2006.01) |
| *H01L 23/522* | (2006.01) |
| *H01L 23/528* | (2006.01) |
| *H01L 49/02* | (2006.01) |
| *H01L 23/00* | (2006.01) |
| *H01L 21/56* | (2006.01) |

(Continued)

(52) U.S. Cl.
CPC ...... *H01L 23/5223* (2013.01); *H01L 21/4846* (2013.01); *H01L 21/561* (2013.01); *H01L 21/78* (2013.01); *H01L 23/528* (2013.01); *H01L 24/17* (2013.01); *H01L 24/81* (2013.01); *H01L 24/97* (2013.01); *H01L 28/10* (2013.01); *H01L 2224/16225* (2013.01); *H01L 2224/16265* (2013.01); *H01L 2924/10253* (2013.01); *H01L 2924/1205* (2013.01); *H01L 2924/1206* (2013.01); *H01L 2924/1427* (2013.01); *H01L 2924/19041* (2013.01); *H01L 2924/19102* (2013.01)

(58) Field of Classification Search
CPC ............. H01L 23/5223; H01L 21/4846; H01L 21/561; H01L 21/78; H01L 23/528; H01L 24/17

See application file for complete search history.

(56) References Cited

U.S. PATENT DOCUMENTS

| | | |
|---|---|---|
| 8,945,998 B2 | 2/2015 | Hsu et al. |
| 2010/0327433 A1 | 12/2010 | Sweeney et al. |
| 2014/0264732 A1 | 9/2014 | Elsherbini et al. |

*Primary Examiner* — Michael Shingleton
(74) *Attorney, Agent, or Firm* — Meyertons, Hood, Kivlin, Kowert & Goetzel, P.C.; Neal E. Persky; Lawrence J. Merkel

(57) ABSTRACT

In some embodiments, a method and/or a system may include an integrated circuit. The integrated circuit may include a semiconductor die. The integrated circuit may include a plurality of wiring layers. At least one metal-insulator-metal (MIM) capacitor may be formed within the plurality of wiring layers. The integrated circuit may include a circuit. The circuit may include at least an inductor and a voltage regulator which, with the MIM capacitor, forms a voltage regulator for the semiconductor die. The circuit may be coupled substantially below at least a portion of the MIM capacitor in the plurality of layers. The circuit may be electrically coupled to the capacitor through the plurality of wiring layers. The integrated circuit may include a plurality of electrical connectors, the plurality of electrical connectors coupled to the second surface at points separate from an area of the second surface that is occupied by the circuit.

18 Claims, 7 Drawing Sheets

(51) Int. Cl.
*H01L 21/78* (2006.01)
*H01L 21/48* (2006.01)

SOC WITH INTEGRATED VOLTAGE REGULATOR USING PREFORMED MIM CAPACITOR WAFER

PRIORITY CLAIM

This application is a claims priority to U.S. Provisional Patent Application No. 62/192,785 entitled "SOC WITH INTEGRATED VOLTAGE REGULATOR USING PREFORMED MIM CAPACITOR WAFER" filed on Jul. 15, 2015, all of which is incorporated by reference herein.

BACKGROUND

Technical Field

Embodiments described herein relate to semiconductor devices and methods for semiconductor device design. More particularly, some embodiments disclosed herein relate to integrated circuits including a wafer formed from a plurality of wiring layers including a MIM capacitor formed in the plurality of wiring layers.

Description of the Related Art

Integrated passive devices (IPDs) include Silicon (Si) die that carry passive devices such as capacitors and inductors for integration into a circuit system. Similar to all other Si chips, these are typically built on one side of a Silicon wafer. The active surface contains all interconnects necessary for connecting from the outside world to the passive device on the chip.

Recently, integrated voltage regulators have been employed in SOCs. Integrated voltage regulators may include an inductor (e.g., coupled inductor voltage regulator) and a capacitor (e.g., deep trench capacitor). Current integrated voltage regulators position a coupled inductor voltage regulator and a deep trench capacitor underneath a substrate of an SOC fanout package. Problems with the current integrated voltage regulator strategy may include, for example, the coupled inductor voltage regulator and the deep trench capacitor taking up too much space on the SOC package and/or blocking SOC signals.

SUMMARY

In some embodiments, a method and/or a system may include an integrated circuit. The integrated circuit may include a semiconductor die. The integrated circuit may include a plurality of wiring layers. At least one metal-insulator-metal (MIM) capacitor may be formed within the plurality of wiring layers. The integrated circuit may include a circuit. The circuit may include at least an inductor and a voltage regulator which, with the MIM capacitor, forms a voltage regulator for the semiconductor die. The circuit may be coupled substantially below at least a portion of the MIM capacitor in the plurality of layers. The circuit may be electrically coupled to the capacitor through the plurality of wiring layers. The integrated circuit may include a plurality of electrical connectors, the plurality of electrical connectors coupled to the second surface at points separate from an area of the second surface that is occupied by the circuit.

BRIEF DESCRIPTION OF THE DRAWINGS

The following detailed description makes reference to the accompanying drawings, which are now briefly described.

Figure 1:
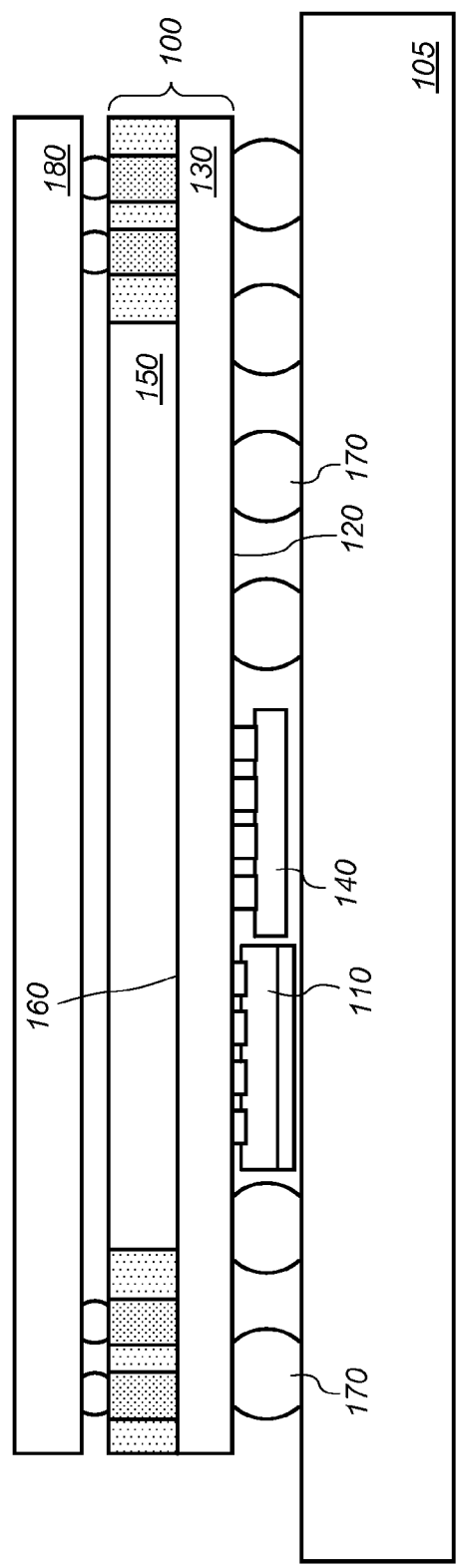
FIG. 1 is a block diagram illustrating an embodiment of a current integrated circuit.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

Definitions

Unless defined otherwise, all technical and scientific terms used herein have the same meaning as commonly understood by one of ordinary skill in the art.

The term "connected" as used herein generally refers to pieces which may be joined or linked together.

The term "coupled" as used herein generally refers to pieces which may be used operatively with each other, or joined or linked together, with or without one or more intervening members.

The term "directly" as used herein generally refers to one structure in physical contact with another structure, or, when used in reference to a procedure, means that one process effects another process or structure without the involvement of an intermediate step or component.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

For decades a race has been run to make integrated circuits not only more efficient but smaller. Integrated circuits have consistently migrated to smaller feature sizes over the years, allowing more circuitry to be packed on each chip. This increased capacity per unit area can be used to decrease cost and/or increase functionality. Typically, as the feature size shrinks the cost per unit and the switching power consumption go down, and the speed goes up. Integrated circuits with nanometer-scale devices are not without their problems. Principal among these problems is leakage current, although innovations in high-κ dielectrics aim to solve these problems. Since these speed and power consumption gains are apparent to the end user, there is fierce competition among the manufacturers to use finer geometries.

Previously voltage regulators were typically located on multilayer boards which electrically coupled the voltage regulators to an integrated circuit. To increase efficiency and save valuable space voltage regulators have been integrated into the structure of the integrated circuit. This change resulted in impedance reduction and Vdroop (typically one will notice a significant drop in CPU voltage when the processor goes from an idle state to a load state, this voltage drop is referred to Vdroop) reduction in the power delivery system. The current integrated voltage approach typically includes positioning coupled inductor voltage regulator and deep trench capacitor underneath an integrated circuit fanout package.

FIG. 1 depicts an embodiment of a block diagram illustrating a current integrated circuit 100 coupled to a multilayer board 105. The integrated circuit 100 includes a coupled inductor voltage regulator and deep trench capacitor (DTC) 110 coupled to a first side 120 of a redistribution layer 130 adjacent to a DTC integrated passive device (IPD) 140. In some embodiments, IPD 140 may exhibit zero inductance, and may be referred to as a zero inductance integrated passive device (ZLIPD). A die 150 may be coupled to a second side 160 of the redistribution layer 130 which electrically connects to a first set of electrical conductors 170. The integrated circuit 100 may include a memory unit 180 coupled to the die 150. There are several disadvantages or issues with this current approach. One disadvantage with the current approach includes that the coupled inductor voltage regulator and deep trench capacitor take a large amount of space. Another disadvantage is that the increased number of components coupled to the underside of the integrated circuit is that it reduces the number of electrical conductors 170 coupled to the underside of the integrated circuit effectively blocking integrated circuit signals. In some embodiments, to overcome the disadvantages of the current integrated circuits it may be advantageous to incorporate a MIM capacitor into a layer in an integrated circuit.

Figure 2:
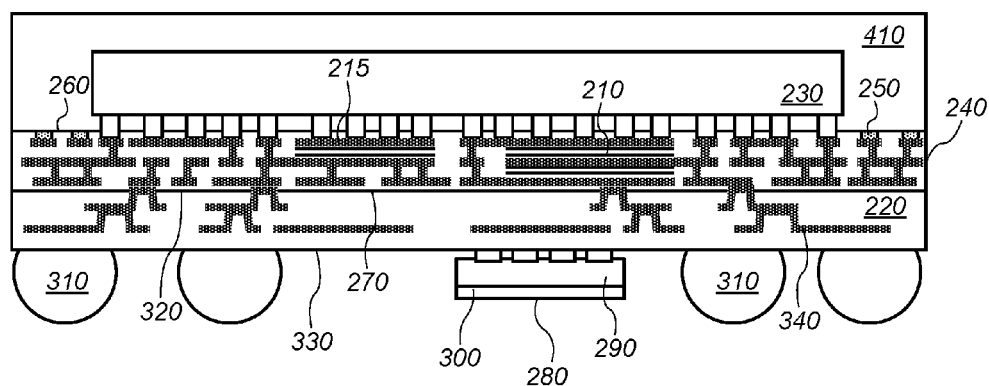
FIG. 2 is a block diagram illustrating an embodiment of an integrated circuit including a MIM capacitor and a redistribution layer (RDL).

FIG. 2 depicts an embodiment of a block diagram illustrating an integrated circuit 200 including a MIM capacitor 210 and a redistribution layer (RDL) 220. In some embodiments, a method and/or a system may include an integrated circuit 200. The integrated circuit may include a semiconductor die 230. The integrated circuit may include a plurality of wiring layers 240. At least one MIM capacitor 210 may be formed within the plurality of wiring layers. Incorporating a MIM capacitor into the plurality of wiring layers may provide several advantages: save space for other packaging features (e.g., deep trench capacitors); reduction of signal blockage from the integrated circuit; a circuit (e.g., coupled inductor voltage regulator (CLVR)) may be coupled or directly attached beneath the MIM capacitor allowing for a shorter distance between the two for communicating with each other increasing efficiency. Fanout layers may be built in to the plurality of wiring layers (e.g., having the effect to reduce this step later).

In some embodiments, a MIM capacitor may have two metal plates around a capacitor dielectric. The capacitor dielectric may be parallel to a semiconductor wafer surface. The top capacitor metal plate may be formed by a planar deposition of a conductive material (e.g., capable of being lithographically patterned and etched using an RIE process). The patterning of the top metal plate may include the use of a mask, and there can be alignment problems with underlying features and vias in connecting to interconnect layers. MIM dielectric materials may need to be carefully selected, due to the potential interaction with or diffusion of the metals (e.g., copper) used for the metal plates. MIM dielectric material restriction may result in limited area capacitance. The use of copper (which has a lower resistivity than aluminum, titanium nitride and tungsten, for example) for the top and bottom metal capacitor plates improves the high-frequency capability and produces a MIM capacitor with higher quality factors (Q-values).

MIM capacitors can provide certain advantages over MOS and p-n junction capacitors because the frequency characteristics of MOS and p-n junction capacitors may be restricted as a result of depletion layers that form in the semiconductor electrodes. A MIM capacitor may exhibit improved frequency and temperature characteristics. Furthermore, MIM capacitors may be formed in the metal interconnect layers, thereby reducing CMOS transistor process integration interactions or complications.

An MIM capacitor typically includes an insulating layer (e.g., a PECVD dielectric) disposed between lower and upper electrodes. Another approach to increasing the capacitance density is using high dielectric constant (k) dielectrics for MIM capacitors. An example of an improved mixed-mode capacitor in a logic circuit, the bottom electrode of the capacitor is polycide and the top electrode is metal. The capacitor dielectric layer may be composed of, for example, silicon oxide, silicon nitride, silicon oxy-nitride, or tantalum oxide. Silicon oxide, silicon nitride and silicon oxy-nitride may be formed by using low-pressure chemical vapor deposition (LPCVD), plasma enhanced chemical vapor deposition (PECVD), or high-density plasma CVD (HDPCVD). In some embodiments, the thickness of the capacitor dielectric layer may be about from 100 to 500 angstroms.

In an example of an integrated circuit device with high Q MIM capacitor, the MIM capacitor dielectric layer may be formed of silicon oxy-nitride ($SiO_xN_y$) which has a high dielectric constant relative to that of silicon dioxide. In some embodiments, platinum may be employed for both the capacitor top plate and storage node structures. A high dielectric constant material such as $Ta_2O_5$ or $BaTiO_3$ may be used for the capacitor dielectric layer. The $Ta_2O_5$ or $BaTiO_3$ capacitor dielectric layer, which may be deposited via chemical vapor deposition (CVD), may have a thickness between about 50 to 200 Angstroms.

In some embodiments, the plurality of wiring layers 240 may further include conductors 250 to connect the semiconductor die 230 from a first surface 260 of the plurality of wiring layers that abuts the semiconductor die to a second surface 270 of the plurality of wiring layers that is opposite to the first surface.

In some embodiments, the integrated circuit 200 may include a redistribution layer 220. The redistribution layer 220 may include a third surface 320 coupled to the second surface 270 of the plurality of layers 240. The redistribution layer 220 may include a fourth surface 330 opposite the third surface 320. In some embodiments, the redistribution layer 220 may further include conductors 340 to connect the third surface 320 to the fourth surface 330.

Figure 3:
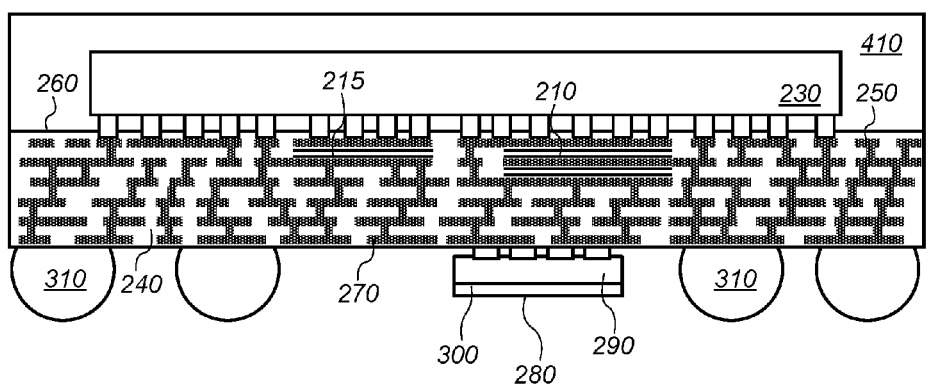
FIG. 3 is a block diagram illustrating an embodiment of an integrated circuit including a MIM capacitor.

In some embodiments, the integrated circuit 200 may include a circuit 280. The circuit may include at least an inductor 290 and a voltage regulator 300. In some embodiments, the inductor 290 and the voltage regulator 300 with the MIM capacitor 210, form a voltage regulator for the semiconductor die. In some embodiments, the circuit 280 may be coupled to the fourth surface 330 of the redistribution layer 220 (e.g., as depicted in FIG. 2). In some embodiments, the circuit 280 may be coupled to the second surface 270 of the plurality of wiring layers 240 (e.g., as depicted in FIG. 3). In some embodiments, the circuit 200 may include a capacitor (e.g., a deep trench capacitor (DTC)).

In some embodiments, the circuit 280 may be coupled substantially below at least a portion of the MIM capacitor 210 in the plurality of layers 240. The circuit 280 may be electrically coupled to the capacitor through the plurality of wiring layers 240 and/or the redistribution layer 220.

In some embodiments, the integrated circuit may include a plurality of electrical connectors 310. The plurality of electrical connectors 310 may connect the integrated circuit 200 to, for example, a circuit board (not depicted in FIG. 2).

In some embodiments, the plurality of electrical connectors may be coupled to the fourth surface 330 of the redistribution layer 220 at points separate from an area of the fourth surface that is occupied by the circuit (e.g., as depicted in FIG. 2). The redistribution layer may electrically couple the plurality of layers and the plurality of electrical connectors. In some embodiments, the plurality of electrical connectors may be coupled to the second surface 270 of the plurality of wiring layers 240 at points separate from an area of the second surface that is occupied by the circuit 280 (e.g., as depicted in FIG. 3).

Figure 4A:
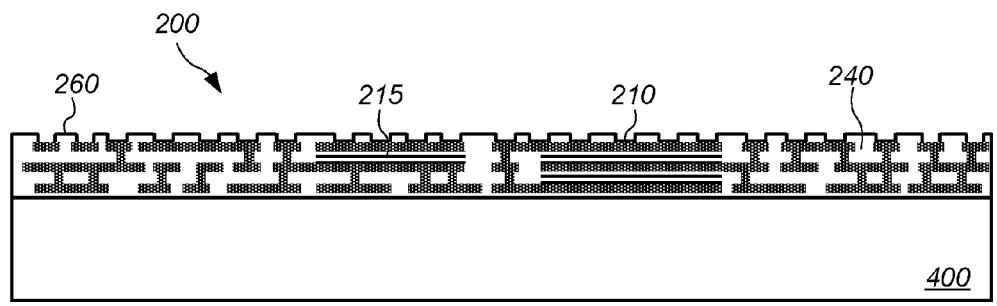
FIGS. 4A-F depict an embodiment of a method of forming an integrated circuit including a MIM capacitor and a redistribution layer (RDL).

In some embodiments, a method may include manufacturing an integrated circuit. FIGS. 4A-F depict a method of forming an integrated circuit 200 including a MIM capacitor 210 and a redistribution layer 220. FIGS. 5A-E depict a method of forming an integrated circuit including a MIM capacitor. The method may include forming a plurality of wiring layers 240 on a base 400 (e.g., as depicted in FIG. 4A and FIG. 5A). At least one MIM capacitor 210 may be formed within the plurality of wiring layers 240. In some embodiments, the base may include a wafer (e.g., a silicon wafer).

Redistribution layer 220 may include materials such as, but not limited to, glass fiber, PPG, ABF, PI (polyimide), PBO (polybenzoxazole), BCB (benzocyclobutene), and WPRs (wafer photo resists such as novolak resins and poly(hydroxystyrene) (PHS) available commercially under the trade name WPR including WPR-1020, WPR-1050, and WPR-1201 (WPR is a registered trademark of JSR Corporation, Tokyo, Japan)). Redistribution layer 220 may be formed using techniques known in the art (e.g., techniques used for polymer deposition).

Redistribution layer 220 may include one or more layers of wires or routing. In certain embodiments, the redistribution layer 220 may include two or more layers of wiring or routing. The routing may be, for example, copper wiring or another suitable electrical conductor wiring. A thickness of the redistribution layer 220 may depend on the number of layers of routing in the substrate. For example, each layer of routing may be between about 5 μm and about 10 μm in thickness. In certain embodiments, redistribution layer 220 may have a thickness of at least about 5 μm and at most about 150 μm.

Figure 4B:
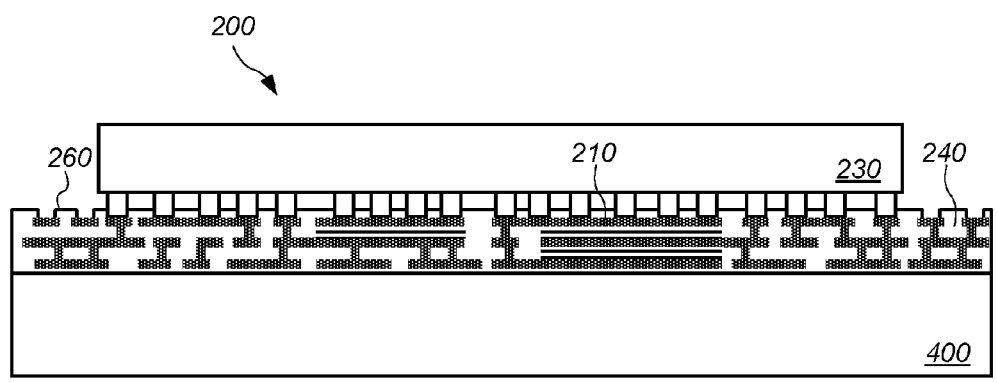
Figure 5A:
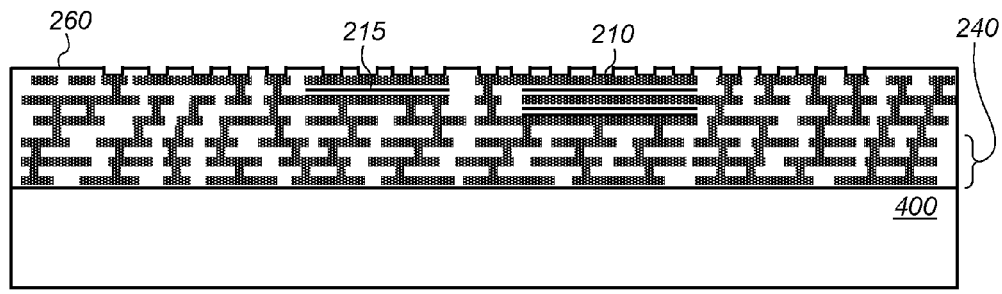
FIGS. 5A-E depict an embodiment of a method of forming an integrated circuit including a MIM capacitor.
Figure 5B:
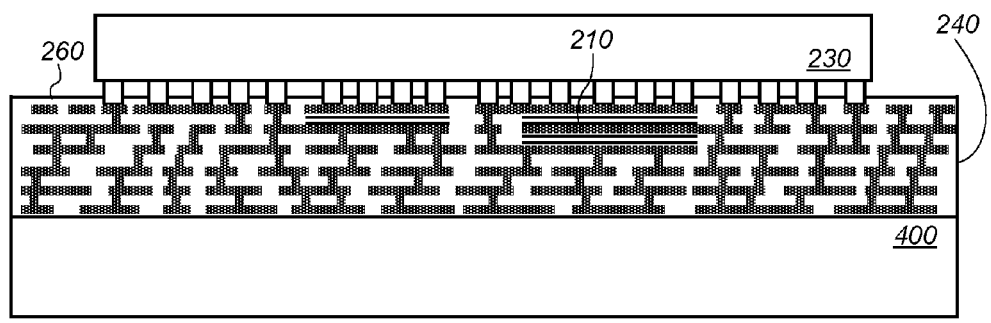

In some embodiments, the method may include coupling a semiconductor die 230 to a first surface 260 of the plurality of wiring layers 240 (e.g., as depicted in FIG. 4B and FIG. 5B). The plurality of wiring layers may include conductors 250 to connect the semiconductor die 230 from the first surface 260 of the plurality of wiring layers 240 to a second surface 320 of the plurality of wiring layers that is opposite to the first surface. In some embodiments, electrical connectors may be used to directly connect or couple the semiconductor die to the plurality of wiring layers.

Figure 4C:
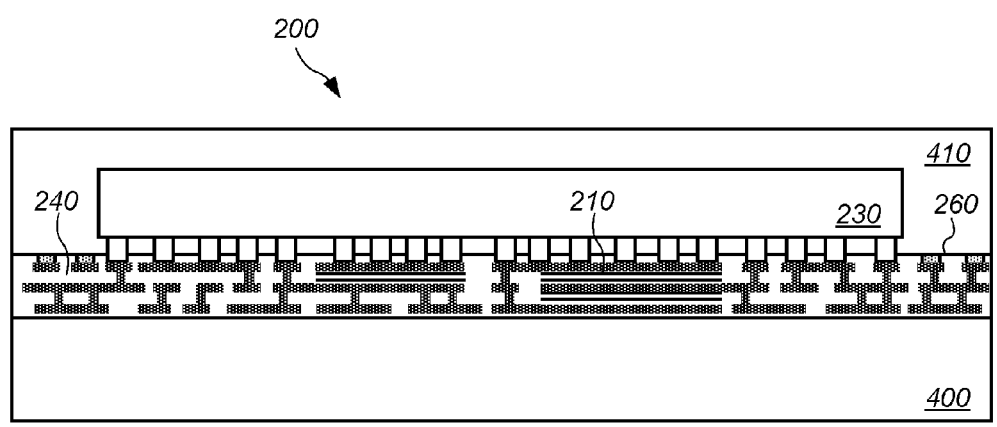
Figure 4D:
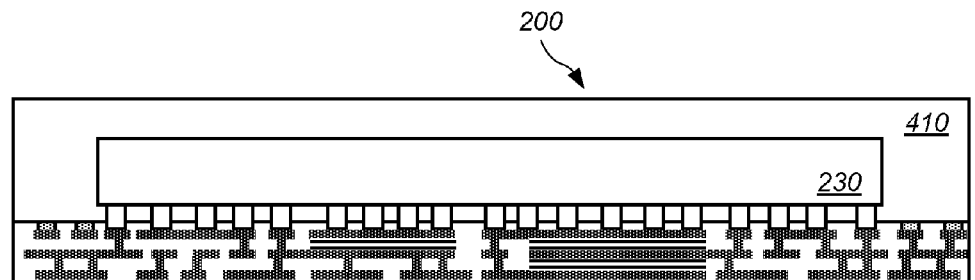
Figure 4E:
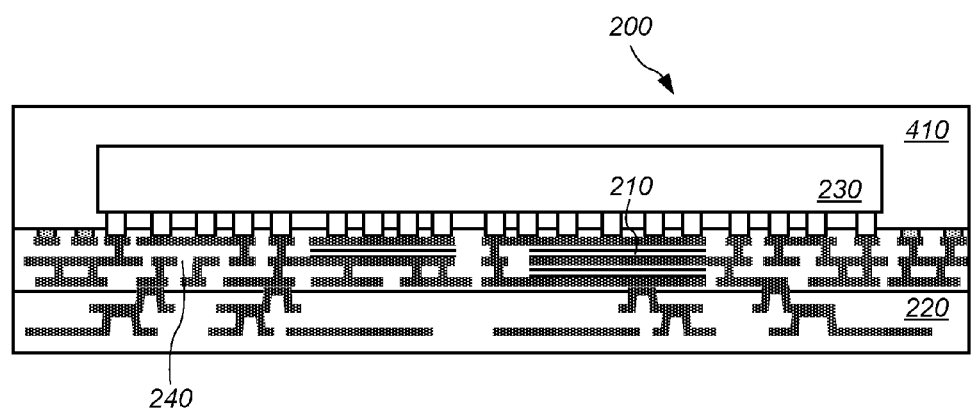
Figure 5C:
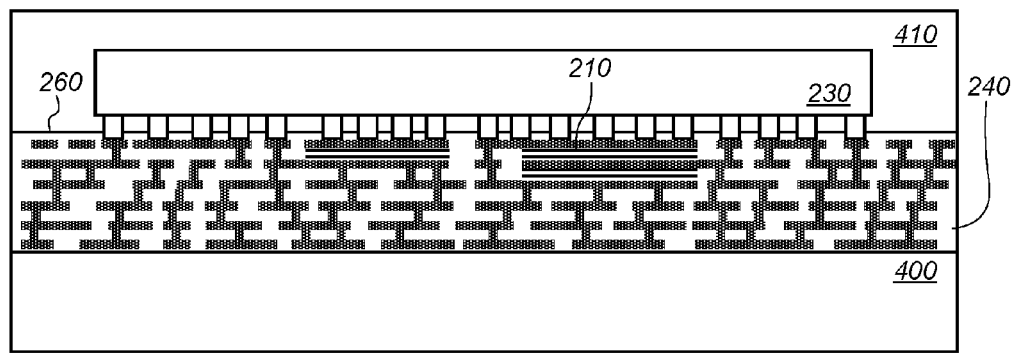
Figure 5D:
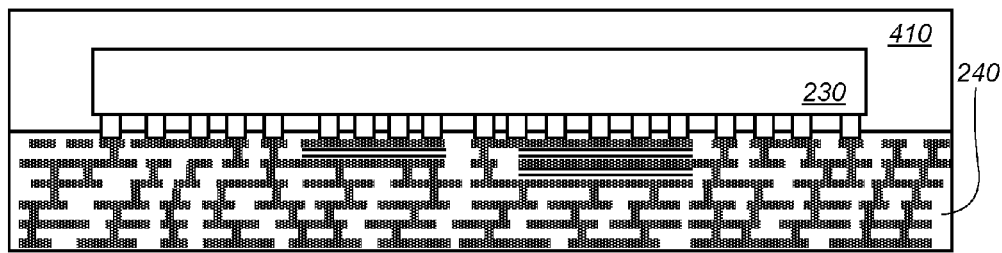

The method may include encapsulating at least a portion of the semiconductor die in an insulating material 410 (e.g., as depicted in FIG. 4C and FIG. 5C). The method may include exposing the second surface 270 of the plurality of wiring layers 240 by removing at least a portion of the base 400 (e.g., as depicted in FIG. 4D and FIG. 5D). In some embodiments, the method may include coupling a redistribution layer 220 to the second surface 270 of the plurality of wiring layers 240 (e.g., as depicted in FIG. 4E).

Figure 4F:
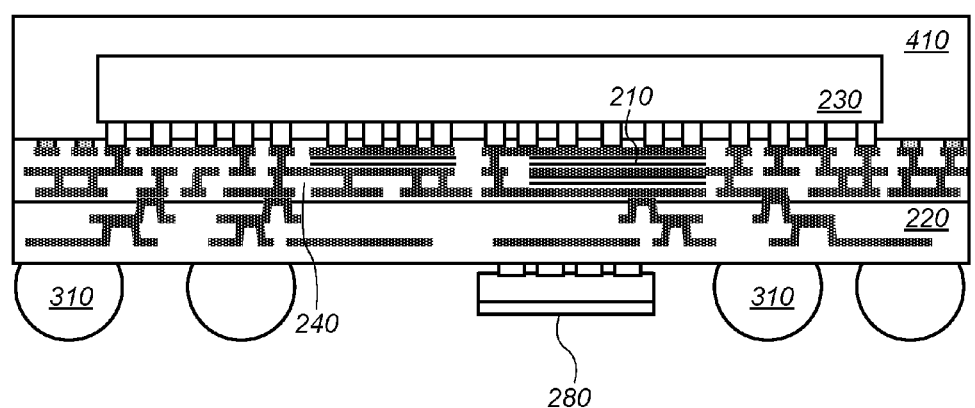
Figure 5E:
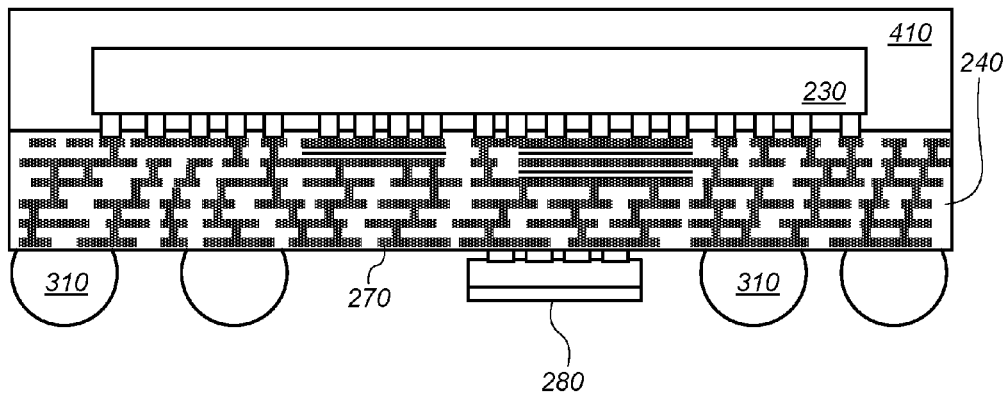

In some embodiments, the method may include coupling a circuit 280 substantially below at least a portion of the MIM capacitor 210 in the plurality of layers 240 (e.g., as depicted in FIG. 4F and FIG. 5E). The circuit 280 may be electrically coupled to the capacitor through the plurality of wiring layers. The circuit 280 may include at least an inductor 290 and a voltage regulator 300 which, with the MIM capacitor, forms a voltage regulator for the semiconductor die 230. In some embodiments, electrical connectors may be used to directly connect or couple the circuit 280 to the integrated circuit 200.

In some embodiments, the method may include coupling a plurality of electrical connectors 310 to the fourth surface 330 (or directly to the second surface 270) at points separate from an area of the fourth and second surfaces that is occupied by the circuit (e.g., as depicted in FIG. 4F and FIG. 5E). The method may include connecting the integrated circuit to a circuit board (not depicted) using the plurality of electrical connectors. The electrical connectors 310 may include metal balls or pillars (e.g., copper, gold, tin, tin/gold, tin/silver, tin/copper, tin/silver/copper), metal plates, or a mesh design (e.g., a crisscrossing trace pattern forming a grid pattern).

The redistribution layer may electrically couple the semiconductor die to the electrical connectors. The redistribution layer may include electrically coupling the MIM capacitor to the circuit.

In some embodiments, the integrated circuit 200 may include a thermal interface material. The thermal interface material may thermally couple, for example, the semiconductor die to the plurality of wires. The thermal interface material may be used to couple the circuit to the integrated circuit. Thermal interface material may include adhesive, thermal grease, an adhesive film, thermal gel, epoxy, underfill, NCP, NCF, ACP, ACF, etc. In some embodiments, thermal interface material may include a viscous fluid substance which increases the thermal conductivity of a thermal interface by filling air-gaps present due to the imperfectly flat and smooth surfaces of the components. The material may have far greater thermal conductivity than air. In electronics, it is often used to aid a component's thermal dissipation via a heat sink. The thermal interface material may be based upon one or more materials including ceramics, metals, carbon, liquid metal, or phase change metal alloy.

Figure 6A:
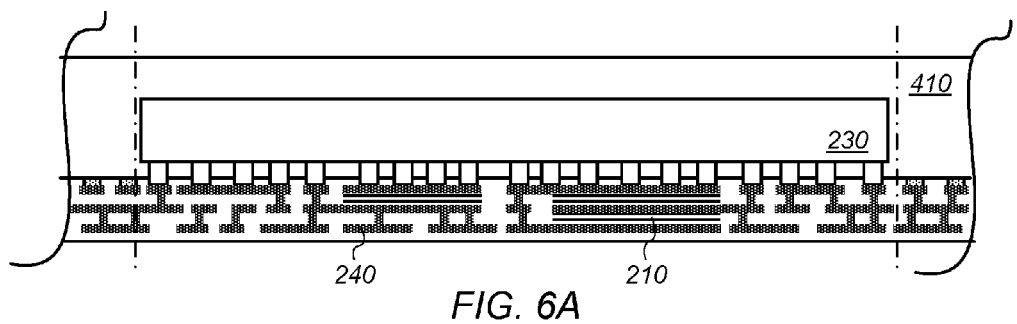
FIGS. 6A-B depict an embodiment of a method of forming an integrated circuit including a MIM capacitor without electrical conductors.
Figure 6B:
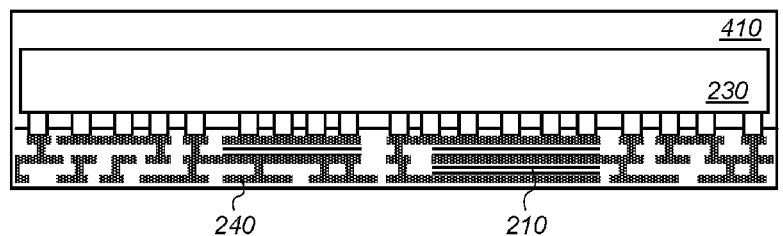

In some embodiments, the method may include coupling a plurality of semiconductor die to a first surface of the plurality of wiring layers. The method may include coupling a circuit substantially below at least a portion of each of the MIM capacitors in the plurality of layers. FIGS. 6A-B depict a method of forming an integrated circuit including a MIM capacitor without electrical conductors. The method may include cutting the plurality of semiconductor die into a plurality of integrated circuit packages (i.e., singulation). Singulation (e.g., saw singulation) cuts a large set of packages into individual second packages. In addition the integrated circuit embodiment depicted in FIG. 6B may be used to build an SOC package.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A method of manufacturing an integrated circuit, comprising:
    forming a plurality of wiring layers on a base, wherein at least one metal-insulator-metal (MIM) capacitor is formed within the plurality of wiring layers;
    coupling a semiconductor die to a first surface of the plurality of wiring layers, wherein the plurality of wiring layers further include conductors to connect the semiconductor die from the first surface of the plurality of wiring layers to a second surface of the plurality of wiring layers that is opposite to the first surface;
    encapsulating at least a portion of the semiconductor die in an insulating material;
    exposing the second surface of the plurality of wiring layers by removing at least a portion of the base;
    coupling a redistribution layer to the second surface of the plurality of wiring layers;
    coupling a circuit substantially below at least a portion of the MIM capacitor in the plurality of layers, wherein the circuit is electrically coupled to the capacitor through the plurality of wiring layers, wherein the circuit includes at least an inductor and a voltage regulator which, with the MIM capacitor, forms a voltage regulator for the semiconductor die;
    coupling a plurality of electrical connectors to the second surface at points separate from an area of the second surface that is occupied by the circuit; and
    connecting the integrated circuit to a circuit board using the plurality of electrical connectors.

2. The method of claim 1, further comprising electrically coupling the semiconductor die to the electrical connectors using the redistribution layer.

3. The method of claim 1, further comprising electrically coupling the MIM capacitor to the circuit using the redistribution layer.

4. The method of claim 1, wherein the base comprises a silicon wafer.

5. The method of claim 1, further comprising:
    coupling a plurality of semiconductor die to a first surface of the plurality of wiring layers;
    coupling a circuit substantially below at least a portion of each of the MIM capacitors in the plurality of layers; and
    cutting the plurality of semiconductor die into a plurality of integrated circuit packages.

6. A method of manufacturing an integrated circuit, comprising:
    forming a plurality of wiring layers on a base, wherein at least one metal-insulator-metal (MIM) capacitor is formed within the plurality of wiring layers;
    coupling a semiconductor die to a first surface of the plurality of wiring layers, wherein the plurality of wiring layers further include conductors to connect the semiconductor die from the first surface of the plurality of wiring layers to a second surface of the plurality of wiring layers that is opposite to the first surface;
    encapsulating at least a portion of the semiconductor die in an insulating material;
    exposing the second surface of the plurality of wiring layers by removing at least a portion of the base;
    coupling a circuit substantially below at least a portion of the MIM capacitor in the plurality of layers, wherein the circuit is electrically coupled to the capacitor through the plurality of wiring layers, wherein the circuit includes at least an inductor and a voltage regulator which, with the MIM capacitor, forms a voltage regulator for the semiconductor die, the circuit coupled;

coupling a plurality of electrical connectors to the second surface at points separate from an area of the second surface that is occupied by the circuit; and connecting the integrated circuit to a circuit board using the plurality of electrical connectors.

7. The method of claim 6, further comprising electrically coupling the semiconductor die to the electrical connectors using the conductors in the plurality of wiring layers.

8. The method of claim 6, further comprising electrically coupling the MIM capacitor to the circuit using the conductors in the plurality of wiring layers.

9. The method of claim 6, wherein the base comprises a silicon wafer.

10. The method of claim 6, further comprising:

coupling a plurality of semiconductor die to a first surface of the plurality of wiring layers;

coupling a circuit substantially below at least a portion of each of the MIM capacitors in the plurality of layers; and cutting the plurality of semiconductor die into a plurality of integrated circuit packages.

11. The method of claim 1, wherein forming a plurality of wiring layers on a base comprises assembling a first portion of the plurality of layers on a semiconductor wafer.

12. The method of claim 1, wherein forming a plurality of wiring layers on a base comprises assembling a first portion of the plurality of layers on a semiconductor wafer, and wherein a second portion of the plurality of layers comprises a redistribution layer applied to MIM layers subsequent to removing the semiconductor wafer.

13. The method of claim 1, wherein the MIM capacitor comprises alternating layers of conductors and insulators.

14. The method of claim 1, wherein the MIM capacitor comprises alternating layers of conductors and insulators, and wherein the conductors comprise metal and/or conducting polymers.

15. The method of claim 6, wherein forming a plurality of wiring layers on a base comprises assembling a first portion of the plurality of layers on a semiconductor wafer.

16. The method of claim 6, wherein forming a plurality of wiring layers on a base comprises assembling a first portion of the plurality of layers on a semiconductor wafer, and wherein a second portion of the plurality of layers comprises a redistribution layer applied to MIM layers subsequent to removing the semiconductor wafer.

17. The method of claim 6, wherein the MIM capacitor comprises alternating layers of conductors and insulators.

18. The method of claim 6, wherein the MIM capacitor comprises alternating layers of conductors and insulators, and wherein the conductors comprise metal and/or conducting polymers.

* * * * *